(12) United States Patent
Huang

(10) Patent No.: US 8,212,757 B2
(45) Date of Patent: Jul. 3, 2012

(54) AMPLIFIER AND SOURCE DRIVER UTILIZING THE AMPLIFIER

(75) Inventor: Da-Rong Huang, Tainan County (TW)

(73) Assignee: Himax Technologies Limited, Fonghua Village, Xinshi Dist., Tainan (TW)

(*) Notice: Subject to any disclaimer, the term of this patent is extended or adjusted under 35 U.S.C. 154(b) by 817 days.

(21) Appl. No.: 12/367,545

(22) Filed: Feb. 8, 2009

(65) Prior Publication Data

US 2010/0201436 A1 Aug. 12, 2010

(51) Int. Cl.
*G09G 3/36* (2006.01)
(52) U.S. Cl. ........................................................ 345/98
(58) Field of Classification Search .................. None
See application file for complete search history.

(56) References Cited

U.S. PATENT DOCUMENTS

| | | | |
|---|---|---|---|
| 4,652,892 A * | 3/1987 | Tanaka ........................... | 347/184 |
| 6,480,178 B1 * | 11/2002 | Itakura et al. ................... | 345/89 |
| 6,774,882 B2 * | 8/2004 | Yamazaki et al. .............. | 345/98 |
| 7,098,904 B2 * | 8/2006 | Kato ............................... | 345/211 |
| 7,573,455 B2 * | 8/2009 | Kim ............................... | 345/100 |
| 7,755,427 B2 * | 7/2010 | Chen .............................. | 330/261 |
| 2009/0085788 A1 * | 4/2009 | Yamazaki et al. ............. | 341/153 |
| 2010/0201436 A1 * | 8/2010 | Huang ........................... | 327/538 |

* cited by examiner

*Primary Examiner* — Peter Vincent Agustin
(74) *Attorney, Agent, or Firm* — Winston Hsu; Scott Margo

(57) ABSTRACT

A source driver includes an amplifier, and the amplifier includes an input stage, an output stage, a first current source, a second current source, a third current source, and a switch module. The first current source is utilized to provide a first bias current to the input stage, the second current source is utilized to provide a second bias current to the output stage, and the third current source is utilized to provide a third bias current. The switch module is utilized for selectively connecting the third current source to the input stage or the output stage.

10 Claims, 4 Drawing Sheets

AMPLIFIER AND SOURCE DRIVER UTILIZING THE AMPLIFIER

BACKGROUND OF THE INVENTION

1. Field of the Invention

The present invention relates to an amplifier, and more particularly, to an amplifier of a source driver.

2. Description of the Prior Art

For the resolution and the frame rate of the liquid crystal display (LCD) are getting greater, it is more difficult for charging pixel electrodes to achieve target voltage levels in time. To reduce the charging time, the driving current of an output buffer in a source driver of the LCD is increased to enhance the driving capability of the output buffer. However, increasing currents of the output buffers results in higher power consumption, and the power saving is therefore becomes an important issue.

SUMMARY OF THE INVENTION

It is therefore an objective of the present invention to provide an output buffer with enhanced driving capability without wasting power.

According to one embodiment of the present invention, a source driver comprises an amplifier, and the amplifier comprises an input stage, an output stage, a first current source, a second current source, a third current source, and a switch module. The first current source is utilized to provide a first bias current to the input stage, the second current source is utilized to provide a second bias current to the output stage, and the third current source is utilized to provide a third bias current. The switch module is utilized for selectively connecting the third current source to the input stage or the output stage.

According to another embodiment of the present invention, an amplifier comprises an input stage, an output stage, a first current source, a second current source, a third current source, and a switch module. The first current source is utilized to provide a first bias current to the input stage, the second current source is utilized to provide a second bias current to the output stage, and the third current source is utilized to provide a third bias current. The switch module is utilized for selectively connecting the third current source to the input stage or the output stage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
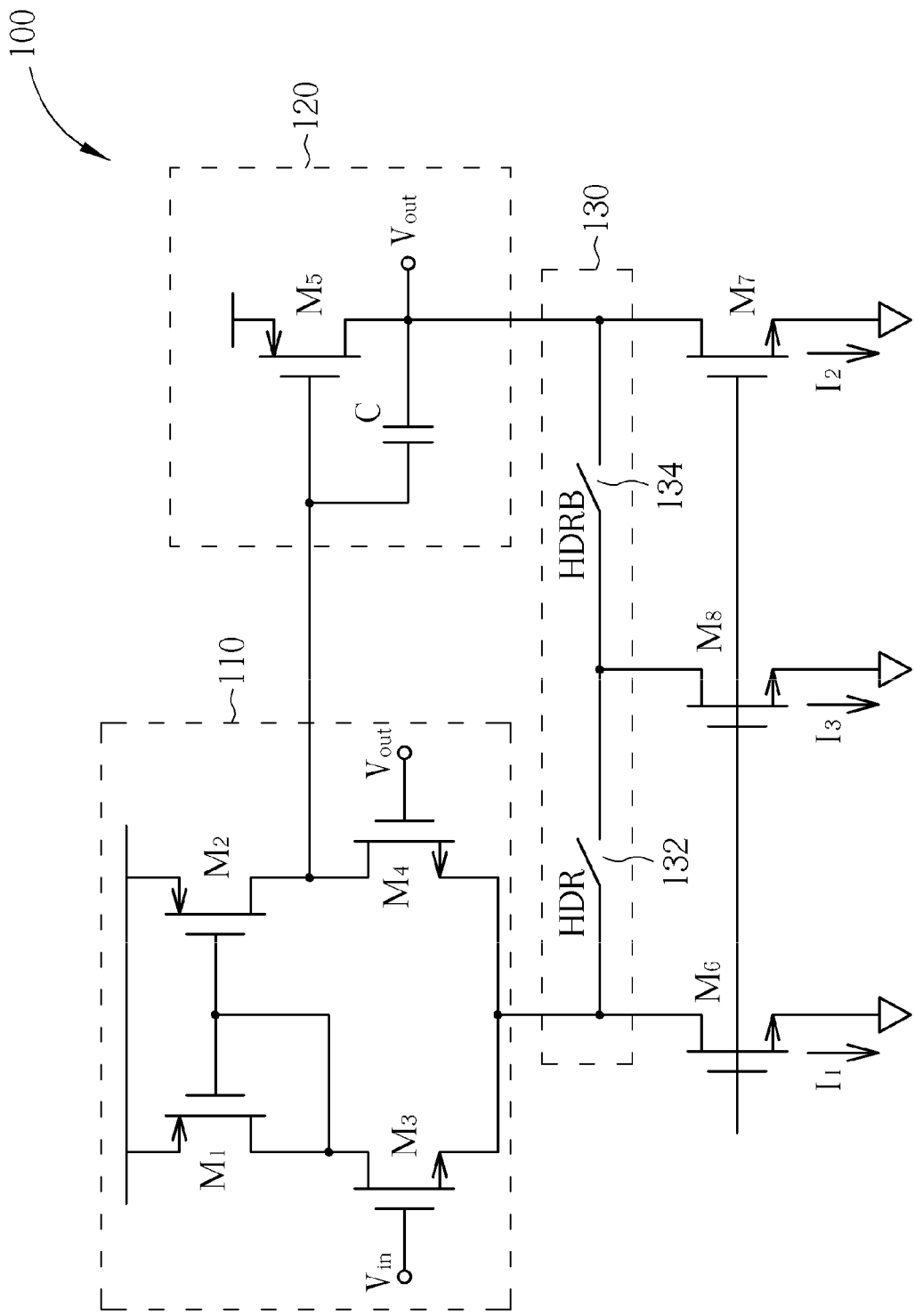
FIG. 1 is a diagram illustrating an amplifier of a source driver of a display.

Please refer to FIG. 1. FIG. 1 is a diagram illustrating an output buffer 100 of a source driver of a display. As shown in FIG. 1, the output buffer 100 is an amplifier, which includes an input stage 110, an output stage 120, a switch module 130, a first current source M6, a second current source M7, and a third current source M8. The input stage 110 includes four transistors M1-M4, the output stage 120 includes a transistor M5, and the switch module 130 includes a first switch 132 and a second switch 134. In this embodiment, the first current source M6 is used for providing a first bias current $I_1$ to the input stage 110, the second current source M7 is used for providing a second bias current $I_2$ to the output stage 120, and a third current source M8 is used for providing a third bias current $I_3$. In addition, the first current source M6, the second current source M7 and the third current source M8 are implemented utilizing current mirrors. Furthermore, the switch module 130 is used for selectively connecting the third current source M8 to the input stage 110 or the output stage 120, where the first switch 132 selectively connects the third current source M8 to the input stage 110, and the second switch 134 selectively connects the third current source M8 to the output stage 120.

Figure 2:
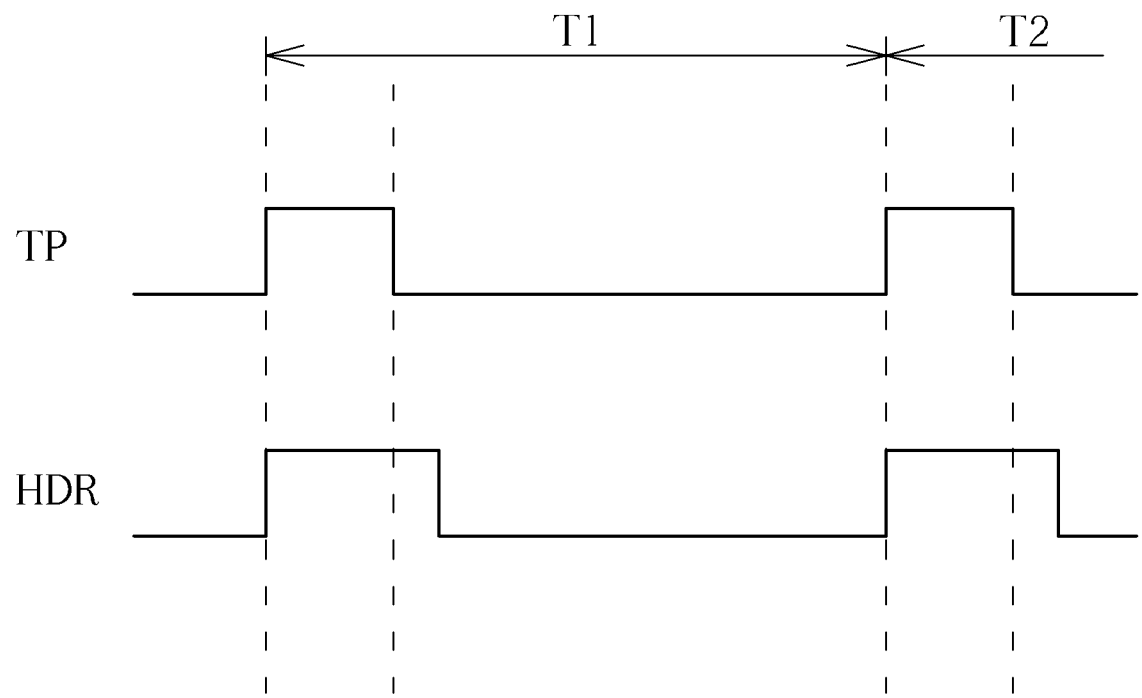
FIG. 2 is a diagram illustrating a relationship between the control signal and the transfer pulse signal according to a first embodiment of the present invention.

In the operations of the amplifier 100, the switch module 130 is controlled by a control signal HDR generated according to a transfer pulse signal TP, where the transfer pulse signal TP is used to trigger the source driver to output display data. The first switch 132 is controlled by the control signal HDR and the second switch 134 is controlled by an inverted control signal HDRB, where the control signal HDR and the inverted control signal HDRB are phase-inverted. FIG. 2 is a diagram illustrating a relationship between the control signal HDR and the transfer pulse signal TP according to a first embodiment of the present invention. As shown in FIG. 2, at a first line period T1, the transfer pulse signal TP is activated for the source driver to drive a row of pixels, and the control signal HDR is activated accordingly. In this embodiment, the activation time of the control signal HDR is longer than that of the transfer pulse signal TP. Then, at a second line period T2, the transfer pulse signal TP is activated for the source driver to drive a next row of pixels, and the control signal HDR is activated accordingly During the activation time of the control signal HDR, the first switch 132 connects the third current source M8 to the input stage 110, and the bias current of the input stage 110 is a summation of the first bias current $I_1$ and the third bias current $I_3$. Therefore, the driving ability of the input stage 110 is enhanced and a slew rate of a signal carrying display data is improved. In detail, in the embodiment shown in FIG. 2, the source driver outputs the display data at a falling edge of a pulse of the transfer pulse signal TP. During the activation time of the control signal HDR, first, a capacitor C in the output stage 120 is fast charged by the current provided by the input stage 110, and when the source driver starts to output the signal carrying display data, an LC (liquid crystal) capacitor in a pixel is fast charged. When the control signal HDR is deactivated, the second switch 134 connects the third current source M8 to the output stage 120 to stabilize the amplifier 100. At this time, the bias current of the output stage 120 is a summation of the second bias current $I_2$ and the third bias current $I_3$.

It is noted that, in FIG. 2, the activation time of the control signal HDR is a smaller part of a period of the control signal HDR; that is, for the majority of the time, the second switch 134 connects the third current source M8 to the output stage 120 to make the amplifier 100 stable.

Figure 3:
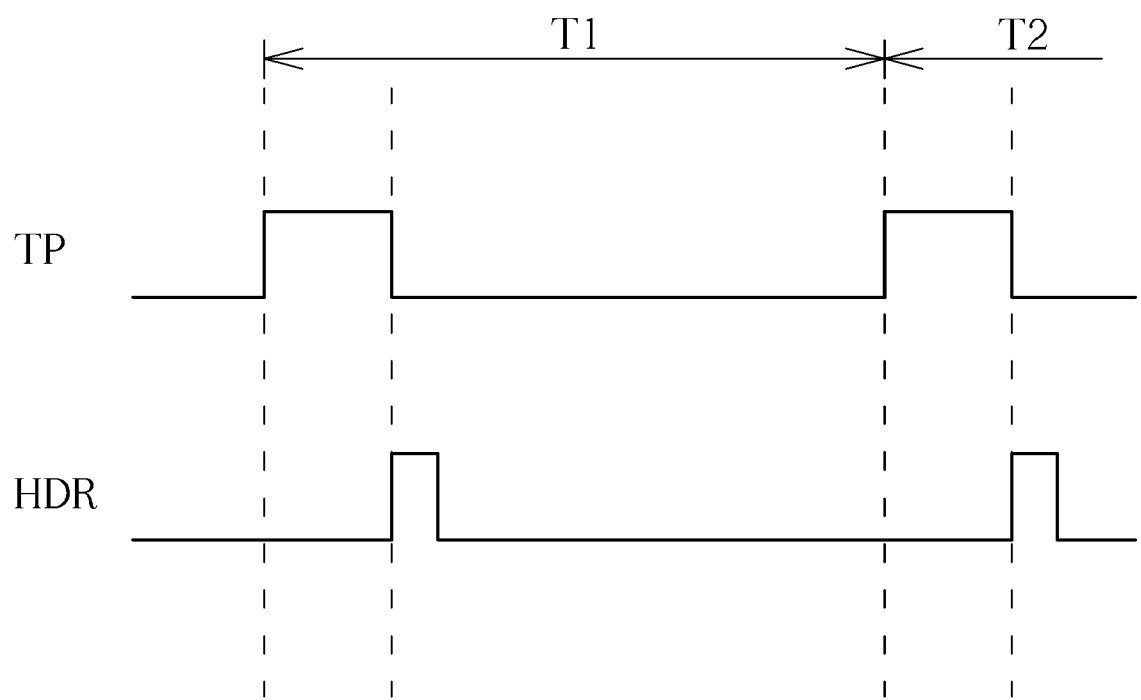
FIG. 3 is a diagram illustrating a relationship between the control signal and the transfer pulse signal according to a second embodiment of the present invention.
Figure 4:
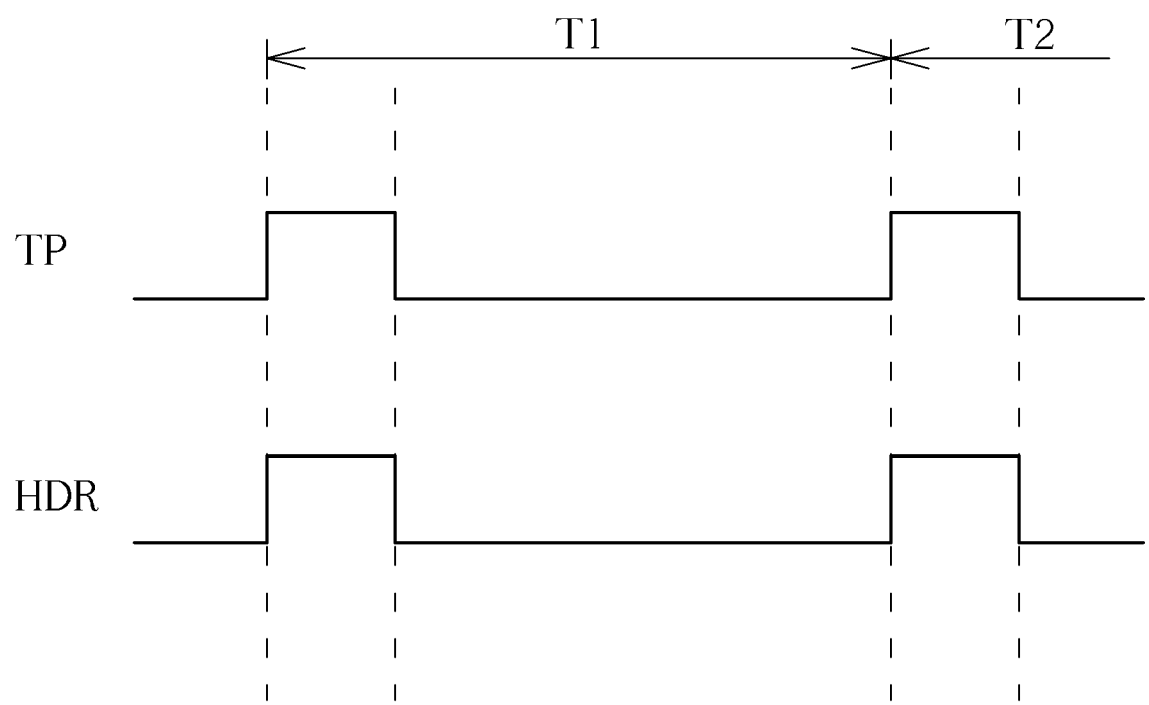
FIG. 4 is a diagram illustrating a relationship between the control signal and the transfer pulse signal according to a third embodiment of the present invention.

FIG. 3 and FIG. 4 are diagrams illustrating relationships between the control signal HDR and the transfer pulse signal TP according to other embodiments of the present invention. In FIG. 3, the control signal HDR is activated after the transfer pulse signal TP is deactivated. In FIG. 4, the control signal HDR is substantially synchronized with the transfer pulse signal TP.

Additionally, in the embodiment shown in FIG. 1, the third bias current $I_3$ is much greater than the first bias current $I_1$ and the second bias current $I_3$. Therefore, when the capacitor C in the output stage or the LC capacitor in the pixel starts to be charged, the third current source M8 provides the third bias current $I_3$ to the input stage 110 to increase the slew rate; and then the third current source M8 provides the third bias current $I_3$ to the output stage 120 to stabilize the amplifier 100.

It should be noted that the input stage 110 and the output stage 120 shown in FIG. 1 are examples. In other embodiments of the present invention, the input stage 110 and the output stage can be a rail-to-rail operation amplifier or other amplifiers. These alternative designs are all within the scope of the present invention.

Briefly summarized, the amplifier in the source driver includes an input stage, an output stage, a first current source, a second current source, a third current source, and a switch module. The switch module is utilized for selectively connecting the third current source to the input stage or the output stage. For the majority of the time, the switch module connects the third current source to the output stage to stabilize the amplifier, and when the driving ability needs to be enhanced, the switch module connects the third current source to the input stage. Therefore, additional current is not needed to enhance the driving ability of the amplifier, and the power consumption is reduced.

Those skilled in the art will readily observe that numerous modifications and alterations of the device and method may be made while retaining the teachings of the invention.

What is claimed is:

1. A source driver comprising:
   an amplifier comprising:
      an input stage;
      an output stage, coupled to the input stage;
      a first current source for providing a first bias current to the input stage;
      a second current source for providing a second bias current to the output stage;
      a third current source for providing a third bias current; and
      a switch module, for selectively connecting the third current source to the input stage or the output stage;
      wherein the switch module is controlled by a control signal generated according to a transfer pulse signal, the transfer pulse signal is utilized to trigger the source driver to output display data, the control signal is activated when the transfer pulse signal is activated, and an activation time of the control signal is equal to or longer than that of the transfer pulse signal.

2. The source driver of claim 1, wherein the switch module comprises a first switch and a second switch, the first switch selectively connects the third current source to the input stage, and the second switch selectively connects the third current source to the output stage.

3. The source driver of claim 1, wherein the first current source, the second current source and the third current source are implemented utilizing current mirrors.

4. The source driver of claim 1, wherein the third bias current is greater than the first bias current or the second bias current.

5. An amplifier comprising:
   an input stage;
   an output stage, coupled to the input stage;
   a first current source for providing a first bias current to the input stage;
   a second current source for providing a second bias current to the output stage;
   a third current source for providing a third bias current; and
   a switch module, for selectively connecting the third current source to the input stage or the output stage;
   wherein the switch module is controlled by a control signal generated according to a transfer pulse signal, the transfer pulse signal is utilized to trigger the source driver to output display data, the control signal is activated when the transfer pulse signal is activated, and an activation time of the control signal is equal to or longer than that of the transfer pulse signal.

6. The amplifier of claim 5, wherein the switch module comprises a first switch and a second switch, the first switch selectively connects the third current source to the input stage, and the second switch selectively connects the third current source to the output stage.

7. The amplifier of claim 5, wherein the first current source, the second current source and the third current source are implemented utilizing current mirrors.

8. The amplifier of claim 5, wherein the third bias current is greater than the first bias current or the second bias current.

9. A source driver comprising:
   an amplifier comprising:
      an input stage;
      an output stage, coupled to the input stage;
      a first current source for providing a first bias current to the input stage;
      a second current source for providing a second bias current to the output stage;
      a third current source for providing a third bias current; and
      a switch module, for selectively connecting the third current source to the input stage or the output stage;
      wherein the switch module is controlled by a control signal generated according to a transfer pulse signal, the transfer pulse signal is utilized to trigger the source driver to output display data, and the control signal is activated after the transfer pulse signal is deactivated.

10. An amplifier comprising:
    an input stage;
    an output stage, coupled to the input stage;
    a first current source for providing a first bias current to the input stage;
    a second current source for providing a second bias current to the output stage;
    a third current source for providing a third bias current; and
    a switch module, for selectively connecting the third current source to the input stage or the output stage;
    wherein the switch module is controlled by a control signal generated according to a transfer pulse signal, the transfer pulse signal is utilized to trigger the source driver to output display data, and the control signal is activated after the transfer pulse signal is deactivated.

* * * * *